(12) United States Patent
Olivier

(10) Patent No.: US 7,167,655 B2
(45) Date of Patent: Jan. 23, 2007

(54) MEASUREMENT SYSTEM FOR WIDE DYNAMIC RANGE OPTICAL POWER METER

(75) Inventor: Christian Olivier, Sainte-Foy (CA)

(73) Assignee: EXFO Electro-Optical Engineering Inc., Quebec (CA)

( * ) Notice: Subject to any disclaimer, the term of this patent is extended or adjusted under 35 U.S.C. 154(b) by 680 days.

(21) Appl. No.: 10/378,000

(22) Filed: Mar. 4, 2003

(65) Prior Publication Data

US 2003/0165009 A1    Sep. 4, 2003

Related U.S. Application Data

(60) Provisional application No. 60/361,297, filed on Mar. 4, 2002.

(51) Int. Cl.
*H04B 10/06* (2006.01)
(52) U.S. Cl. ............................ 398/202; 250/214 LS
(58) Field of Classification Search ........ 250/214 AG, 250/214 LS; 330/278; 327/123 R, 123; 398/202
See application file for complete search history.

(56) References Cited

U.S. PATENT DOCUMENTS 5,287,340 A    2/1994    Chapman et al.
5,900,960 A *  5/1999    Reime ...................... 398/202
6,707,025 B1 * 3/2004    Azary et al. ............ 250/214 AG
6,864,724 B1 * 3/2005    Kim et al. ................... 327/103

OTHER PUBLICATIONS

Cooper, William David, Electronic Instrumentation and Measurement Techniques, 1978, Prentice-Hall, Inc., Englewood Cliffs, New Jersey.
Graeme, J.G., Photodiode Amplifiers, 1996, McGraw-Hill, New York.

* cited by examiner

*Primary Examiner*—Mark Hellner
(74) *Attorney, Agent, or Firm*—Thomas Adams

(57) ABSTRACT

A measurement system for wide dynamic range operation in optical power measurement applications is disclosed. The system provides amplification over a wide dynamic range without glitch, signal loss or transient effect during range switch. This is achieved by combining first and second multi-gain photodiode amplifiers (10/1,10/2), with their input ports connected in common to receive the input signal from a photodiode, and by switching their gain settings to get continuous readings of a photodiode signal. More specifically, the gain setting of the first amplifier is changed only when the signal from the other amplifier is being output, and vice versa. Such an amplification system ensures a smooth transition within a wide dynamic range while monitoring various signal levels, e.g., monitoring processes with substantial variations of optical power from very high levels to very low levels.

14 Claims, 2 Drawing Sheets

MEASUREMENT SYSTEM FOR WIDE DYNAMIC RANGE OPTICAL POWER METER

Priority is claimed from the U.S. Provisional patent application No. 60/361,297 filed Mar. 4, 2002.

TECHNICAL FIELD

This invention relates to measurement systems and is especially, but not exclusively, applicable to measurement systems comprising photodiode amplifiers for optical power meters and to such optical power meters per se. The invention is especially applicable to the continuous reading of a photodiode current varying over a relatively wide range.

BACKGROUND ART

Known optical power meters use a photodiode detector to produce an electrical current that is dependent upon the intensity of light incident upon the detector and an amplifier to produce a voltage proportional to the electrical current. Photodiode amplifiers are described extensively in the text book "Photodiode Amplifiers" authored by J. G. Graeme and published by McGraw-Hill, New York, 1996. Typically, the photodiode amplifier comprises an operational amplifier with a feedback resistor coupled to the inverting input port, the output voltage of the amplifier then being proportional to the photodiode current which is applied to the inverting input port of the operational amplifier. The largest measurable value is determined by the amplifier saturation characteristics, whereas the smallest measurable value is determined by the amplifier noise and the resistor noise; the optical dynamic range of such photodiode amplifier configuration typically is about 30 dB (i.e., $10^3$). In contrast, photodiode detectors are capable of measuring optical power levels ranging from −110 dBm to +10 dBm.

In practice, therefore, the dynamic range of the light intensity may well exceed that of the amplifier. It is known to extend the effective dynamic range of such a photodiode amplifier by providing several feedback resistors in parallel, each with a different resistance value, and a gain selection switch for changing the amplifier gain by connecting different ones of the resistors into the feedback loop. Such an amplifier, having three gain settings, is shown in FIG. 1, labelled PRIOR ART. If the single-resistor photodiode amplifier has an optical dynamic range of about 30 dB (i.e., $10^3$), the total optical dynamic range of such a three-gain range photodiode amplifier might be as much as 90 dB (i.e., $10^9$).

A disadvantage of the amplifier shown in FIG. 1, and other known multi-range photodiode amplifiers, however, is that the operation of the gain selection switch causes glitches, signal loss and transient effects, which may result in invalid readings, or require readings to be interpolated where there are gaps in the readings coinciding with selection switch operation.

It is also known to improve the dynamic range of the basic photodiode amplifier by using a differential photodiode amplifier. Thus, in their U.S. Pat. No. 5,287,340, D. B. Chapman et al. describe a photodiode amplifier in which the photodiode cathode and anode are connected to respective inputs of a differential amplifier. The output voltage of the operational amplifier is proportional to the photodiode current. According to Chapman et al., this arrangement reduces shot noise and hence improves dynamic range Chapman et al. do not, however, disclose gain switching or address the attendant problems described above.

DISCLOSURE OF INVENTION

The present invention seeks to eliminate, or at least mitigate, these disadvantages of known photodiode amplifiers; or at least provide an alternative.

According to the present invention, a measurement system for providing an output signal proportional to an input signal over a wide dynamic range comprises a first amplifier unit, for example a current-to-voltage converter, having a first gain and a second amplifier unit, for example a second current-to-voltage converter, having a second gain that is different from the first gain. Both amplifier units are connected to receive the input signal in common and, in operation, to provide a first signal and a second signal, respectively, each proportional to the input signal. The measurement system also comprises a control unit for selecting the first and second output signals alternatively as the output signal of the measurement system, and in dependence upon the amplitude of the input signal.

Preferably, the first and second amplifier units comprise first and second current-to-voltage converters having their respective inputs connected to the cathode and anode, respectively, of a photodiode for converting an optical signal into said input signal.

The control unit may comprise means for digitizing the first and second signals simultaneously and supplying the resulting digital signals to a digital signal processing unit for controlling said selection of said first and second signals, and respective gains of the current to voltage converters, in dependence upon the optical power input. The digital signal processor may also scale a digital readout according to the gain of the current to voltage converter whose signal has been selected.

Preferably, the first gain is higher than the second gain and the first amplifier unit is switchable between said first gain and at least a third gain that is less than the second gain, and the control unit is operable to select the second signal for output when the input signal, while increasing, reaches a first predetermined level, prior to changing the gain of the first amplifier to said third gain and, conversely, to select the first signal for output when the input signal, while decreasing, reaches a second predetermined level, prior to changing the gain of the first amplifier unit back to the first gain.

The control unit may be operable further to change the gain of the first amplifier to said third gain when the increasing input signal reaches a third predetermined level that is higher than the first predetermined level by a preset amount and to change the gain of the first amplifier back to the first gain when the decreasing input signal reaches a fourth predetermined level that is lower than the second predetermined level by a preset amount.

The differences between the first and second predetermined levels and between the third and fourth predetermined levels may provide a required hysteresis.

The gain of the second amplifier unit also may be switchable between said second gain and at least a fourth gain that is greater than the third gain. The control unit then may control the first amplifier unit to switch gain settings while the second output voltage is selected for output, and to cause the second amplifier unit to change gain settings while the first output voltage is selected for output The predetermined reference levels will generally be determined so as to define a series of overlapping ranges which provide a dynamic range for the measurement system that may be far in excess of the dynamic range of each of the amplifier units. This enables a power meter, for example, incorporating the measurement system to provide continuous readings of an input signal over a wide dynamic range.

Each of the current-to-voltage converters may comprise an operational amplifier having a plurality of feedback resistors which can be selected alternatively to change its gain. The gain selection unit then may comprise a selector switch for connecting the plurality of feedback resistors selectively between an output port of the operational amplifier and an inverting input port of the operational amplifier, each of the plurality of resistors corresponding to one of the gain settings of the associated amplifier unit.

The control unit may comprise a microprocessor programmed to determine the level of the input signal indirectly by monitoring the first and second signals from the two amplifier units, compare either of them with the predetermined reference levels, and control the selector switches and voltage selection in the required sequences.

Preferably, the useful range of each gain should overlap to insure continuous reading over the entire range, which may be achieved by choosing the predetermined reference levels for gain switching from low to high and high to low so that corresponding up/down levels differ by an amount sufficient to provide some hysteresis on gain switching.

BRIEF DESCRIPTION OF THE DRAWINGS

An embodiment of the invention will now be described, by way of example only, with reference to the accompanying drawings, in which.

DETAILED DESCRIPTION OF PREFERRED EMBODIMENTS

Figure 1:
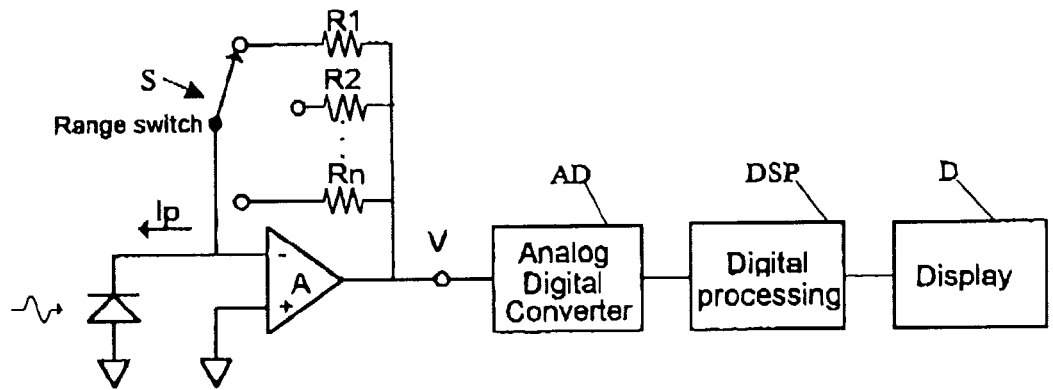
FIG. 1, labelled PRIOR ART, is a schematic block diagram of a known multi-gain photodiode amplifier.

Referring to FIG. 1, a known photodiode amplifier comprises a photodiode P having its cathode connected to the inverting input of an operational amplifier A and to the selector of a gain selector switch S. The anode of the photodiode P and the non-inverting input of the operational amplifier A are connected to ground. Three feedback resistors R1, R2 and Rn having different values are connected in common to the output of the operational amplifier A and to respective ones of three contacts of the selector switch S. The output of the operational amplifier also is connected to an analog-to-digital converter AD which digitizes the output voltage V of amplifier A and supplies it to a digital signal processor DSP which controls a display D.

Operation of the selector switch S selects different ones of the resistors R1, R3, . . . , Rn to change the gain of the operational amplifier A. The output voltage V is proportional to the photodiode current Ip, the actual value being determined by the resistor selection.

Figure 2:
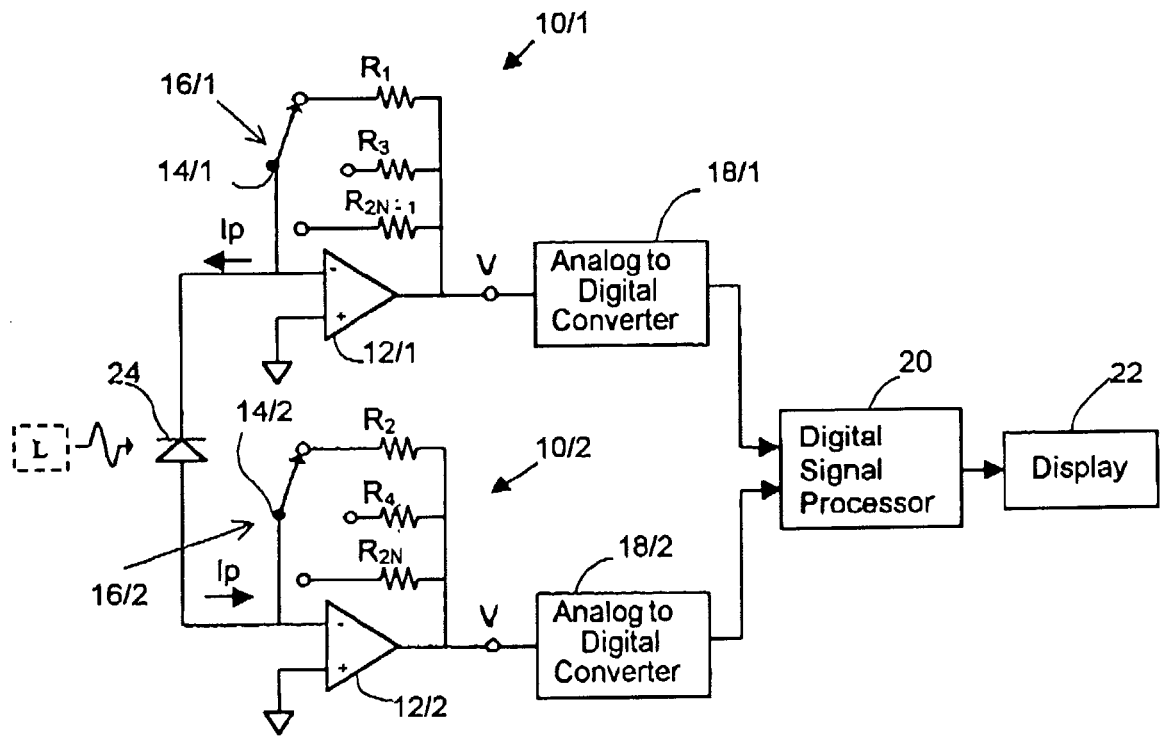
FIG. 2 is a simplified schematic diagram of a photodiode amplifier comprising two multi-gain photodiode amplifier units with a control unit for gain and output voltage selection.

Referring now to FIG. 2, a measurement system, specifically a photodiode amplifier, embodying the present invention and suitable for use in an optical power meter or other equipment comprises first and second similar multi-gain photodiode amplifiers 10/1 and 10/2. First photodiode amplifier 10/1 comprises an operational amplifier 12/1 having its non-inverting input grounded and its inverting input connected to the cathode of a photodiode 24 which receives an optical signal and converts it to a corresponding input signal, ie., photodiode current Ip. The inverting input also is connected to the selector 14/1 of a selector switch 16/1, which has several other terminals connected to a bank of resistors $R_1, R_3, \ldots, R_{2N-1}$. (For convenience, only three are shown). Opposite ends of the resistors $R_1, R_3, \ldots, R_{2N-1}$ are connected in common to the output of the operational amplifier 12/1 and to an input of an analog-to-digital (A-D) converter 18/1 which digitizes the output voltage V1 of the operational amplifier 12/1 and supplies it to a digital signal processing unit 20 which provides a corresponding digital readout. The digital readout may be supplied to a display unit 22, which may be internal or external and so is shown in broken lines in FIG. 2, or to, for example, a data acquisition system. The output voltage V1 of the amplifier unit 12/1 is proportional to the current Ip in the photodiode 24 and the selected one of resistors $R_1, R_3, \ldots, R_{2N-1}$.

Second photodiode amplifier unit 12/2 comprises a corresponding set of components 12/2, 14/2, 16/2, 18/2 and resistors $R_2, R_4, \ldots, R_{2N}$ connected in a similar manner. The non-inverting input of operational amplifier 12/2 also is connected to ground and its inverting input is connected to the anode of the photodiode 24. The output voltage V2 of the second amplifier unit 12/2, which is proportional to the photodiode current Ip and the selected one of resistors $R_2, R_4, \ldots, R_{2N}$, is digitized by analog-to-digital converter 18/2 and supplied to the digital signal processor 20. As will be described in more detail later, in dependence upon the voltage level relative to predetermined reference levels, the processor 20 selects samples of the voltages V1 and V2 alternatively for processing and display and controls the selector switches 16/1 and 16/2 so that the gain of either amplifier unit is changed only when the signal from the other amplifier unit has been selected.

Thus, the A-D converters 18/1 and 18/2 and the processor 20 constitute a control unit which selects, in dependence upon the optical power input, the gains of the current-to-voltage converters 10/1 and 10/2, and the outputs of the current-to-voltage converters, and also scales the digital readout according to the gain of the current-to-voltage converter whose output has been selected.

The two sets of feedback resistors are designated as "odd" resistors $R_1, R_3, \ldots, R_{2N-1}$ and "even" resistors $R_2, R_4, \ldots, R_{2N}$ to indicate that their resistance values are intercalated or interlaced. For example, if $R_1$ has the highest resistance (providing the highest gain G1), $R_2$ has the second highest value providing gain G2, $R_3$ has the third-highest value providing gain G3, and so on.

If the gain selector switch 16/1 of amplifier 12/1 is set to select resistor $R_1$ and the gain selector switch 16/2 of amplifier 12/2 is set to select resistor $R_2$, then the output voltage V1 at the output of the operational amplifier 12/1 and the output voltage V2 at the output of the amplifier 12/2 are respectively:

$$V1 = R_1 \cdot Ip \quad [2]$$

$$V2 = -R_2 \cdot Ip \quad [3]$$

where Ip is the current in photodiode 24. As can be seen, output voltages V1 and V2 have opposite signs because the photodiode current Ip does not flow in the same direction in both amplifiers.

These two analog output signals V1 and V2 are converted simultaneously to digital signals by the analog-to-digital converters 18/1 and 18/2, respectively, and the digital samples supplied to the digital signal processor (DSP) 20 which can select the appropriate samples from voltage V1 or voltage V2. If resistor $R_1$ sets the gain of amplifier unit 10/1 so that its dynamic range is appropriate for input currents ranging from 1 nA to 1 µA, and resistor $R_2$ sets the gain of amplifier unit 10/2 so that its dynamic range is suitable for input currents ranging from 1 µA to 1 mA, then the DSP 20 will select the voltage V1 for photodiode currents lower than 1 µA and select voltage V2 for photodiode currents higher than 1 µA. Thus, in theory, if the dynamic range of each amplifier is 30 dB, the optical dynamic range of this configuration is about 60 dB ($10^6$) without operation of the gain selection switches 16/1 and 16/2.

The DSP 20 tracks the selected voltage, i.e., not only its amplitude but whether it is increasing or decreasing, and anticipates the next gain setting which needs to be selected for the other amplifier unit before selecting samples from the voltage from such other amplifier. For example, if the photodiode current Ip is decreasing, and the DSP 20 is using samples of signal V2 with resistor $R_2$ selected for amplifier unit 10/2, and detects that the value of signal V2 is nearing the bottom of the corresponding dynamic range, the DSP 20 will operate selector switch 16/1 to select resistor $R_1$ and set amplifier unit 10/1 to the correspondingly higher gain before selecting samples of signal V1 for output/display. Conversely, if values of signal V2 are getting close to the upper end of the dynamic range corresponding to selection of resistor $R_2$, the DSP 20 will select resistor $R_3$ for amplifier unit 10/1 before selecting samples of signal V1, so that the correct gain for amplifier unit 10/1 will be set before the signal reaches the end of the dynamic range corresponding to resistor $R_2$ on amplifier unit 10/2. This process can be repeated with any gain setting. Because each selector switch is operated only when the output voltage of the corresponding amplifier is not selected for use by the processor 20, the amplifier output voltage may vary continuously, without glitches and transitions, over a range that is far in excess of the dynamic range of either of the operational amplifiers 12/1 and 12/2 individually.

In the specific example given above, the ranges 1 nA to 1 µA and 1 µA to 1 mA do not overlap. In practice, however, the predetermined reference levels at which the gain settings of a particular amplifier are changed are chosen so that there is an overlap, i.e., the voltage at which the processor 20 changes from one amplifier to the other amplifier when the voltage is increasing is higher than the voltage at which it changes back when the voltage is decreasing. Hence, there is a hysteresis effect.

Figure 3:
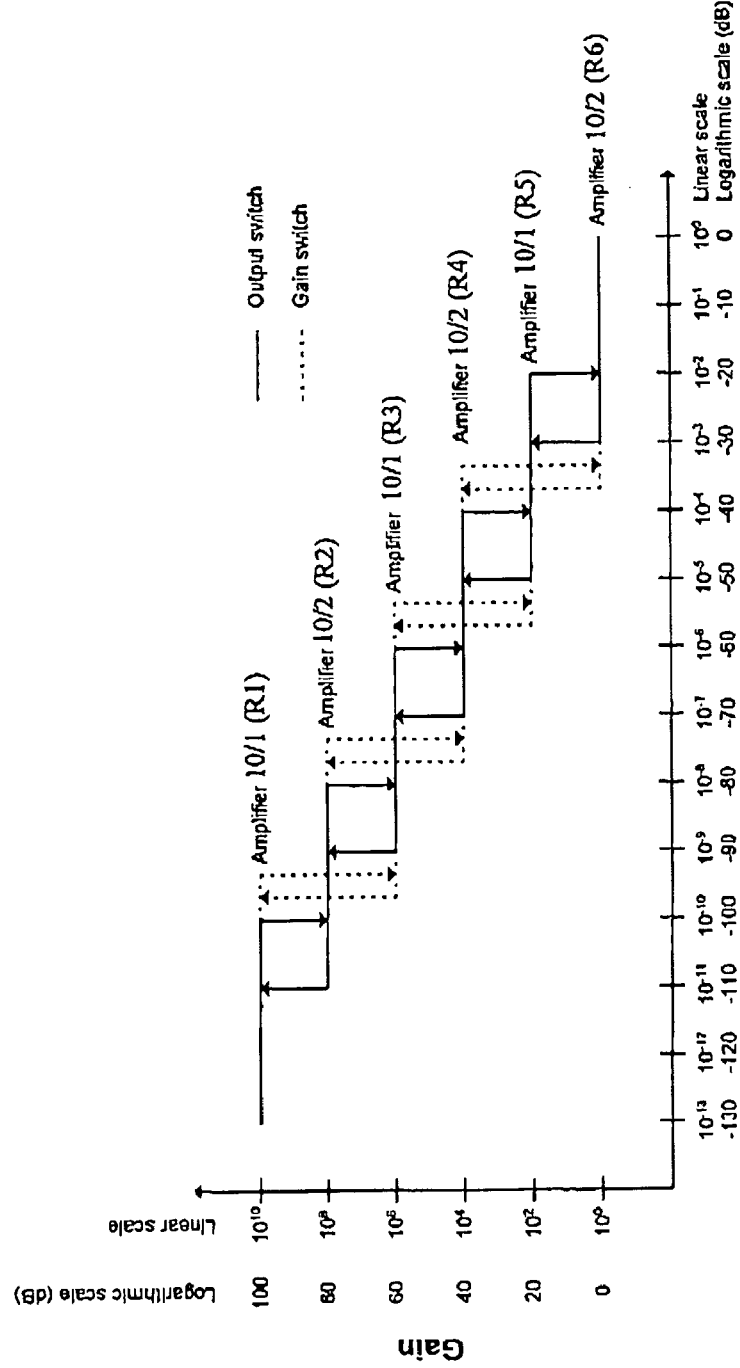
FIG. 3 illustrates operation of the photodiode amplifier of FIG. 2.

Operation of the amplifier of FIG. 2 will now be described in more detail with reference to FIG. 3, which illustrates the signal input relative to full scale for different gain settings. For convenience, it has been assumed that the amplifiers 10/1 and 10/2 each have three gain settings selected by resistors $R_1$, $R_3$, $R_5$ and $R_2$, $R_4$, $R_6$, respectively. Changes in the selection of voltages V1 and V2 are shown in full lines while changes in the gain settings of the two amplifier units are shown in broken lines.

At each gain setting, each of the operational amplifiers 12/1 and 12/2 has a dynamic range of 30 dB. The processor 20 is programmed with a series of reference levels which its uses to determine when to change the output voltage selection and gain settings. By monitoring the input signal and selecting the appropriate gain setting for one or other of the amplified units, according to the input signal amplitude, the processor 20 enables the measurement system to provide continuous readings of the photodiode current Ip over a range of 130 dB, without signal loss, glitches or transient effects caused by gain/range switching. It should be noted that, although the dynamic range of each operational amplifier is 30 dB, and there are six gain settings, the total dynamic range is only 130 dB (not 180 dB) because there is a 10 dB difference between the levels at which a change is made from voltage V1 to V2 for a particular gain setting, and the corresponding change from voltage V2 back to voltage V1.

With the input current Ip less than, say, −110 dB relative to full scale, the processor 20 has selector switch 16/1 set to resistor $R_1$ so that amplifier unit 10/1 has a gain of 100 dB, and selector switch 16/2 set to resistor $R_2$ so that amplifier unit 10/2 has a gain of 80 dB. Also, the processor 20 is using the voltage V1 from amplifier unit 10/1 as the output signal. As the increasing input current Ip reaches −100 dB relative to full scale, the processor 20 selects voltage V2, from amplifier unit 10/2, as the output signal/digital readout, as represented in FIG. 3 by the vertical transition (downwards) at −100 dB. When the photodiode current Ip continues to increase and reaches about −93 dB, the processor 20 operates selector switch 16/1 to select resistor $R_3$ and change the gain of photodiode amplifier 10/1 to 60 dB.

If the input current Ip continues to increase, and reaches −80 dB, the processor 20 selects voltage V1 again, from amplifier unit 10/1, as the output signal, as represented by the downwards transition at −80 dB. When the input current Ip continues to increase and reaches about −73 dB, processor 20 operates selector switch 16/2 to select resistor $R_4$ and change the gain of photodiode amplifier 10/2 to 40 dB.

So long as the input current Ip keeps increasing, this sequence repeats until the input current Ip is in the range from −30 dB to 0 dB of full scale, resistor $R_5$ has been selected to set the gain of amplifier unit 10/1 to 20 dB, resistor $R_6$ has been selected to set the gain of photodiode amplifier 10/2 to 0 dB, and the processor 20 has selected voltage V2 as the output signal.

When the input current Ip is decreasing, the above-described sequence will be reversed, but with the important distinction that the "reverse" changes in the selection of voltages V1 and V2 take place at reference levels that are lower by 10 dB than the corresponding reference levels at which the "upwards" changes took place. Likewise, the "reverse" changes in the gain of each amplifier will each take place at a reference level that is lower by about 3 dB than the corresponding "upwards" change.

For example, assuming that, having reached about −70 dB, the input current Ip does not continue to increase but rather begins to decrease, the gain selector switch 16/2 will not be operated at −73 dB. Only when the input current Ip reaches about −77 dB of full scale will the processor 20 operate the selector switch 16/2 to select resistor $R_2$ and change the gain of amplifier unit 10/2 back to 80 dB. Likewise, only when the input current Ip has decreased to −90 dB will the processor 20 select the voltage V2 from amplifier unit 10/2 as the output signal. Also, the processor 20 will wait until the input current Ip has decreased to about −97 dB before operating selector switch 16/1 to select resistor $R_1$ and change the gain of amplifier 10/1 to 100 dB again.

The difference of about 10 dB between the reference levels at which the voltages V1 and V2 are selected, depending upon whether the input current is increasing or decreasing, reduces the risk of small fluctuations in the input current Ip causing the processor 26 to switch back and forth, i.e., a kind of hysteresis is introduced. The same applies to the difference of about 3 dB between the references levels at which the gain settings are changed.

It should be noted that, when used in or with a power meter, the measurement system may also be used in applications comprising a tunable light source (L) (shown in broken lines in FIG. 2) for supplying an optical input signal whose wavelength varies over a predetermined range. The control unit then would provide an output signal representing the corresponding optical power of the optical input signal.

The signal to be measured can be a voltage instead of a current. In that case, two voltage amplifiers would be used instead of the two current-to-voltage converters. Also, the measurement system can be used with any kind of sensor that converts a physical signal to an electrical signal (voltage or current).

INDUSTRIAL APPLICABILITY

Amplifiers embodying the present invention advantageously allow photodiode current to be measured over a wide dynamic range without glitch, signal loss or transient effects during range switching. This allows a smooth transition within a wide dynamic range while monitoring various signal levels, e.g., monitoring processes with substantial variations of optical power from very high levels to very low levels. Embodiments of the invention are especially suitable for use with scanning instruments, such as optical spectrum analysers which scan over a ranges of wavelengths.

The invention claimed is:

1. A measurement system for providing an output signal proportional to an input signal (Ip) over a wide dynamic range comprises a first amplifier unit (10/1) having a first gain (G1) and a second amplifier unit (10/2) having a second gain (G2) that is different from the first gain, both amplifiers being connected to receive the input signal in common and, in operation, to provide a first signal (V1) and a second signal (V2), respectively, each proportional to the input signal, and a control unit (16/1,16/2,18/1,18/2,20) for selecting the first and second output signals alternatively as an output signal of the measurement system and in dependence upon the amplitude of the input signal.

2. A measurement system according to claim 1, wherein the first gain (G1) is higher than the second gain (G2) and the first amplifier unit (10/1) is switchable between said first gain (G1) and at least a third gain (G3) that is less than the second gain, and the control unit (16/1,16/2,18/1,18/2,20) is operable to select the second signal (V2) for output when the input signal (Ip), while increasing, reaches a first predetermined level, and then to change the gain of the first amplifier to said third gain (G3) and, conversely, to select the first signal (V1) for output when the input signal, while decreasing, reaches a second predetermined level, and then to change the gain of the first amplifier unit back to the first gain (G1).

3. A measurement system according to claim 2, wherein the second amplifier unit (10/2) is switchable between said second gain (G2) and at least a fourth gain (G4) that is less than the third gain (G3), and the control unit is operable to select the first signal (V1) for output when the input signal, while increasing, exceeds the first predetermined level by a prescribed amount, and then to change the gain of the second amplifier unit to said fourth gain (G4) and, conversely, to select the second signal (V2) for output when the input signal, while decreasing, is less than the second predetermined level by a prescribed amount, and then to change the gain of the second amplifier unit back to the second gain.

4. A measurement system according to claim 2, wherein the control unit is operable further to change the gain of the first amplifier unit (10/1) to said third gain (G3) when the increasing input signal reaches a third predetermined level that is higher than the first predetermined level by a preset amount and to change the gain of the first amplifier unit (10/1) back to the first gain (G1) when the decreasing input signal reaches a fourth predetermined level that is lower than the second predetermined level by a preset amount.

5. A measurement system according to claim 3, wherein the control unit is operable further to change the gain of the first amplifier unit (10/1) to said third gain (G3) when the increasing input signal reaches a third predetermined level that is higher than the first predetermined level by a preset amount and to change the gain of the first amplifier unit (10/1) back to the first gain (G1) when the decreasing input signal reaches a fourth predetermined level that is lower than the second predetermined level by a preset amount.

6. A measurement system according to claim 3, wherein the control unit is operable further to change the gain of the second amplifier unit (10/2) to said fourth gain (G4) when the increasing input signal exceeds the first predetermined level by a preset amount and to change the gain of the second amplifier unit back to the first gain (G1) when the decreasing input signal is less than the second predetermined level by a preset amount.

7. A measurement system according to claim 4, wherein the control unit is operable further to change the gain of the second amplifier unit (10/2) to said fourth gain (G4) when the increasing input signal exceeds the first predetermined level by a preset amount and to change the gain of the second amplifier unit back to the first gain (G1) when the decreasing input signal is less than the second predetermined level by a preset amount.

8. A measurement system according to claim 5, wherein the control unit is operable further to change the gain of the second amplifier unit (10/2) to said fourth gain (G4) when the increasing input signal exceeds the first predetermined level by a preset amount and to change the gain of the second amplifier unit back to the first gain (G1) when the decreasing input signal is less than the second predetermined level by a preset amount.

9. A measurement system according to claim 1, wherein the control unit is arranged to determine the level of the input signal (Ip) by monitoring one of the first and second signal.

10. A measurement system according to claim 1, wherein the first and second amplifier units each have a dynamic range of about 30 dB and, when selecting the first and second voltages, the processor provides a difference of about 10 dB between the level at which the selection is changed with the input signal increasing and the level at which selection is reversed when the input signal is decreasing.

11. A measurement system according to claim 1, wherein each amplifier unit comprises an operational amplifier (12/1,12/2) having a plurality of feedback resistors ($R_1, R_3, \ldots, R_N$; $R_2, R_4, \ldots, R_{N+1}$) and the gain selection unit comprises a first selector switch (16/1) and a second selector switch (16/2) each for connecting the corresponding plurality of feedback resistors selectively between an output port of the operational amplifier and an inverting input port of the operational amplifier, each of the plurality of resistors corresponding to one of the gain settings of the associated amplifier unit (10/1,10/2).

12. A measurement system according to claim 1, comprising a photodiode for converting an optical signal into said input signal.

13. A measurement system according to claim 12, wherein each amplifier unit comprises a current-to-voltage converter having an input connected to a respective one of the cathode and anode of said photodiode.

14. A measurement system according to claim 12, further comprising means for varying the wavelength of the optical signal over a predetermined range and wherein the control unit provides an output signal representing the corresponding optical power of the optical signal.

* * * * *